United States Patent [19]

Smith

[11] Patent Number: 5,134,545
[45] Date of Patent: Jul. 28, 1992

[54] INSULATIVE CRADLE ISOLATION STRUCTURE FOR ELECTRICAL COMPONENTS

[75] Inventor: Darryl K. Smith, Spring, Tex.

[73] Assignee: Compaq Computer Corporation, Houston, Tex.

[21] Appl. No.: 709,888

[22] Filed: Jun. 4, 1991

[51] Int. Cl.$^5$ .............................................. H05K 7/20
[52] U.S. Cl. .................................. 361/388; 174/16.3; 165/185; 361/386
[58] Field of Search ............... 363/141; 165/80.3, 185; 174/16.3; 357/79, 81; 361/383, 384, 386–388, 399, 400, 405, 417, 419, 420

[56] References Cited

U.S. PATENT DOCUMENTS

| | | | |
|---|---|---|---|
| 3,766,440 | 10/1973 | Baird | 361/388 |
| 4,646,203 | 2/1987 | Ngo | 361/386 |
| 4,739,447 | 4/1988 | Lecomte | 361/386 |
| 4,899,255 | 2/1990 | Case | 361/386 |
| 5,019,942 | 5/1991 | Clemens | 361/388 |

Primary Examiner—Gerald P. Tolin
Attorney, Agent, or Firm—Konneker & Bush

[57] ABSTRACT

Using a specially designed isolation structure, a pair of relatively high voltage electrical components are mounted on a metal heat sink structure secured to a side edge portion of a printed circuit power supply board. The isolation structure includes an aluminum oxide insulating cradle member having a rectangular, plate-like body portion with an inner side secured to the heat sink, and an outer side on which a spaced pair of generally U-shaped external rib structures are formed. First portions of the components are received in the interiors of the rib structures, with the balance of each component projecting outwardly from its associated rib structure. A suitable clamping structure is used to press the received components against the underlying body portion of the cradle member. The external rib structures advantageously function to inhibit shifting of the components along the body portion, and also serve as shields to increase the minimum air gap clearance lengths between the mounted components and the heat sink structure.

16 Claims, 2 Drawing Sheets

INSULATIVE CRADLE ISOLATION STRUCTURE FOR ELECTRICAL COMPONENTS

BACKGROUND OF THE INVENTION

1. Field of the Invention

The present invention relates generally to insulation apparatus for electrical components, and more particularly relates to insulative apparatus for supporting an electrical component in a manner maintaining a predetermined minimum air space clearance length between the supported component and a closely adjacent metal structure such as a heat sink plate.

2. Description of Related Art

Conformance to Underwriter's Laboratories (UL) standards, and various international electrical codes and standards, typically requires that a minimum effective air space clearance length be maintained between certain relatively high voltage electrical components and adjacent electrically conductive material such as metal heat sink structures upon which the components are mounted. As an example of these standards, it is typically required that all surface portions of electrical components handling at least 300 volts but less than 400 volts be spaced apart from adjacent electrically conductive structures by an effective minimum air path length (or an equivalent, lesser path length through a solid insulative material) of 8 mm. Higher voltage components are required to have correspondingly greater minimum effective air path clearance lengths to the adjacent electrically conductive structures. The purpose of these minimum spacing requirements is to guard against potentially dangerous short circuiting between the components and the adjacent electrically conductive structures.

On its face, at least, this seems a relatively simple safety standard to comply with. However, various difficulties have been encountered in uniformly adhering to this spacing standard due, primarily, to the conventional structures and methods commonly utilized to support the electrical components adjacent electrically conductive structures from which they must be at least minimally isolated.

One commonly encountered situation in which uniform adherence to this spacing standard is particularly difficult is where the component is, for heat dissipation purposes, secured to a metal heat sink member. A typical method of doing this is to encapsulate the high voltage component in an insulating shroud, such as a silicon rubber encapsulating tube, and then compressively clamp the shrouded component against the metal heat sink. The purpose of maintaining a compressive force on the shrouded component is twofold. Up to a certain point, such compressive force desirably increases the dielectric strength (i.e., the electrical resistance) of the insulating material while at the same time increasing its thermal conductivity.

The use of silicon rubber encapsulating material, while a relatively simple and inexpensive approach to the electrical isolation task at hand, is not entirely satisfactory for two primary reasons. First, as is well known, from an electrical insulating standpoint silicon rubber is typically considered to be a low voltage insulating material, and is not particularly well suited to high voltage insulating applications. Second, silicon rubber is not a particularly hardy material and tends to be rather easily torn during installation and subsequent handling. Once this insulation material is torn, of course, the possibility arises that a dangerously short air spark path will be formed between the shrouded component and the adjacent metal heat sink.

Another conventional method utilized to mount high voltage electrical components on a metal heat sink structure is to provide a spaced series of essentially planar isolating pads, each formed from a suitable rigid insulating material such as a ceramic material. The spaced apart pads are positioned flat against a side surface of the heat sink, the electrical components are positioned against the outer sides of their associated pads, and the in-place components are pressed against their pads (utilizing a suitable clamping mechanism), thereby exerting the desired compressive forces on both the components and their underlying pads.

Like its silicon rubber shroud counterpart, this isolation technique has not proven to be wholly satisfactory in practice for two primary reasons. First, to properly position the components and their associated insulation/isolation pads on the heat sink structure, and relative to one another, it has typically been necessary to employ a significant amount of assembly fixturing. This necessity, of course, tends to undesirably increase the overall fabrication cost of the finished product.

Second, a heretofore unavoidable characteristic of this component support and isolation technique is that the electrical components tend to shift or "creep" on their underlying pads toward a side edge portion thereof. The closer the shifting component gets to such pad side edge, the shorter the minimum effective air gap length between the component and the underlying metal heat sink structure becomes, the minimum length of such air gap being geometrically dependent on the proximity between the supported component and such pad side edge. In many cases, even a relatively small, undiscernible shift of the component can create a potentially dangerous reduction in the minimum effective isolation distance between the component and the metal heat sink structure.

It can be readily seen from the foregoing that it would be highly desirable from a safety standpoint to provide improved apparatus and methods for supporting high voltage electrical components in a thermally conductive relationship with, yet in uniformly maintained spatial isolation from an electrically conductive structure such as a metal heat sink member. It is accordingly an object of the present invention to provide such apparatus and methods.

SUMMARY OF THE INVENTION

In carrying out principles of the present invention, in accordance with a preferred embodiment thereof, apparatus is provided for mounting an electrical component on a side surface of a thermally and electrically conductive structure, such as a metal heat sink, in a manner electrically insulating a first portion of the mounted component from the structure, thermally communicating the first component portion with the structure, and reliably maintaining at least a predetermined minimum air gap clearance length between the balance of the mounted component and the structure.

From a broad perspective, the apparatus comprises an isolation cradle member formed from an electrically insulative material, preferably an aluminum oxide ceramic material, having a relatively high degree of thermal conductivity. The isolation cradle member includes a plate-like body portion having a first side, and a second side bounded by a peripheral edge. Rib means are formed on the body portion, adjacent the aforementioned peripheral edge thereof, and project outwardly from the second side of the body portion.

The rib means are operative to define an external pocket on the second side of the body portion, the pocket receiving a first portion of the electrical component with such first component portion in contact with the second side of the body portion. The rib means also function to limit shifting of the received first component portion in a direction parallel to the second side of the body portion.

Attachment means are provided for securing the body portion to the aforementioned side surface of the electrically and thermally conductive structure, with the first side of the body portion facing the side surface of the structure. Additionally, clamping means are provided for engaging the mounted component and exerting a compressive force on the component and an underlying section of the body portion in a manner increasing both the dielectric strength and the thermal conductivity of the underlying section of the body portion.

In addition to supporting the electrical component, and limiting undesirable shifting thereof relative to the body portion of the isolation cradle member, the rib means act as a "shield" to desirably increase the minimum effective air gap clearance length between the mounted electrical component and the underlying thermally and electrically conductive structure.

DETAILED DESCRIPTION

Figure 1:
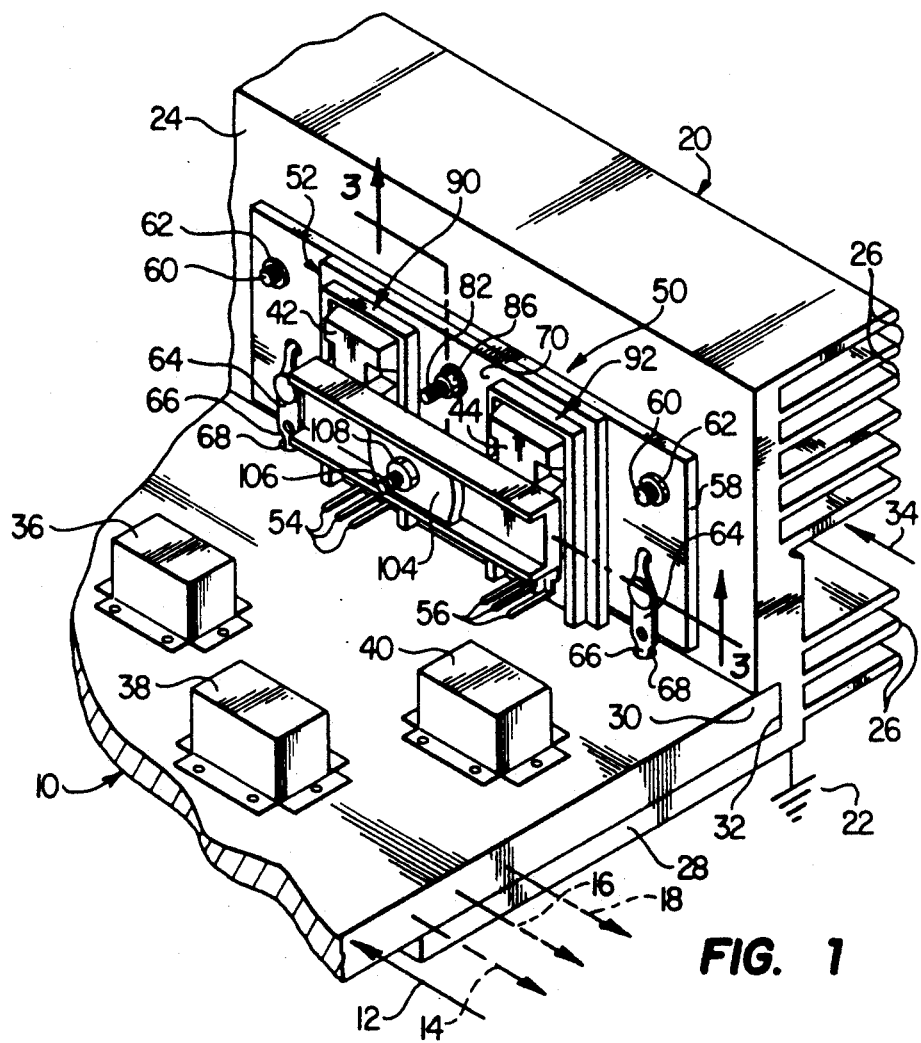
FIG. 1 is a fragmentary perspective view of portion of a representative printed circuit power supply board structure having a pair of high voltage electrical components operatively supported in an insulating cradle support member which embodies principles of the present invention.

Perspectively illustrated in FIG. 1 is a corner portion of a printed circuit power supply board 10 which is representative of an operating environment in which principles of the present invention may be advantageously incorporated. The power supply board 10 is of a type commonly mounted within the housing of a computer and operative to receive a 110 V AC power supply 12 and, as schematically depicted, responsively generate various power supply outputs 14, 16 and 18 to other operating components and systems of the computer. As required, the representative power supply outputs 14, 16 and 18 may have stepped-up or stepped-down AC voltages, or stepped-up or stepped-down rectified DC voltages.

For heat dissipation purposes, an extruded aluminum heat sink member 20 is provided and appropriately grounded as indicated by the reference numeral 22. The heat sink member 20 has an elongated upstanding side wall portion 24 from which a vertically spaced series of horizontal cooling fin portions 26 rearwardly project. Extending forwardly (i.e., leftwardly) from the bottom of wall portion 24 is a thinner support lip portion 28 which underlies the circuit board 10 as shown.

A rear edge portion 30 of the circuit board 10 is received and suitably retained within an elongated horizontal channel 32 formed in the front side of the heat sink wall 24 at its juncture with the support lip 28. As illustrated, the front side surface of the vertical heat sink wall 24 overlies the circuit board rear edge portion 30. The heat dissipation capabilities of the heat sink are enhanced by the operation of a cooling fan (not shown) which flows cooling air longitudinally through the gaps between the heat sink fins 26.

The various electrical voltage transformation and rectification operations of the power supply board 10 are carried out by a series of active electrical components which are mounted on the board and operatively connected to its printed circuitry. This series of components representatively includes components 36, 38 and 40 mounted on the top side of the board 10 and spaced forwardly apart from the vertical heat sink wall 24.

The series also representatively includes two relatively high voltage, high heat generating components 42 and 44 (for example, a rectifier and a diode) having essentially flat elongated rectangular configurations. The electrical operation of these five representative components, and the power supply board 10 of which they form a part, is conventional and forms no part of the present invention.

According to a key feature of the present invention, the components 42, 44 are mounted on the front side of the vertical heat sink wall 24 by an isolation support structure 50 which incorporates therein a uniquely configured and operative insulating support cradle member 52. As illustrated, and as subsequently described, the components 42, 44 are vertically supported, and have bottom end leads 54, 56 which are operatively connected to the printed circuitry of the power supply board 10 in a conventional manner.

Figure 2:
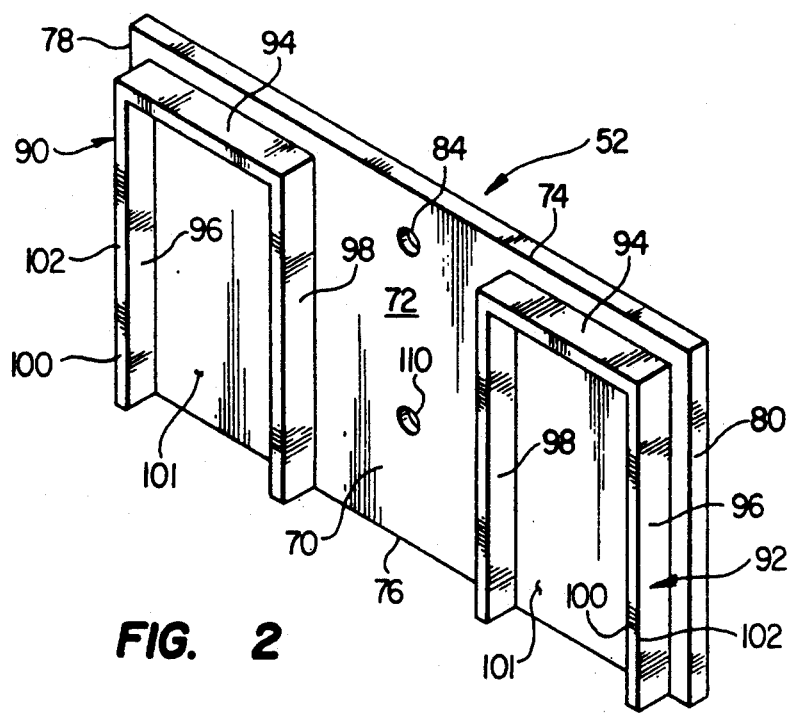
FIG. 2 is an enlarged scale perspective view of the insulating cradle support member.
Figure 3:
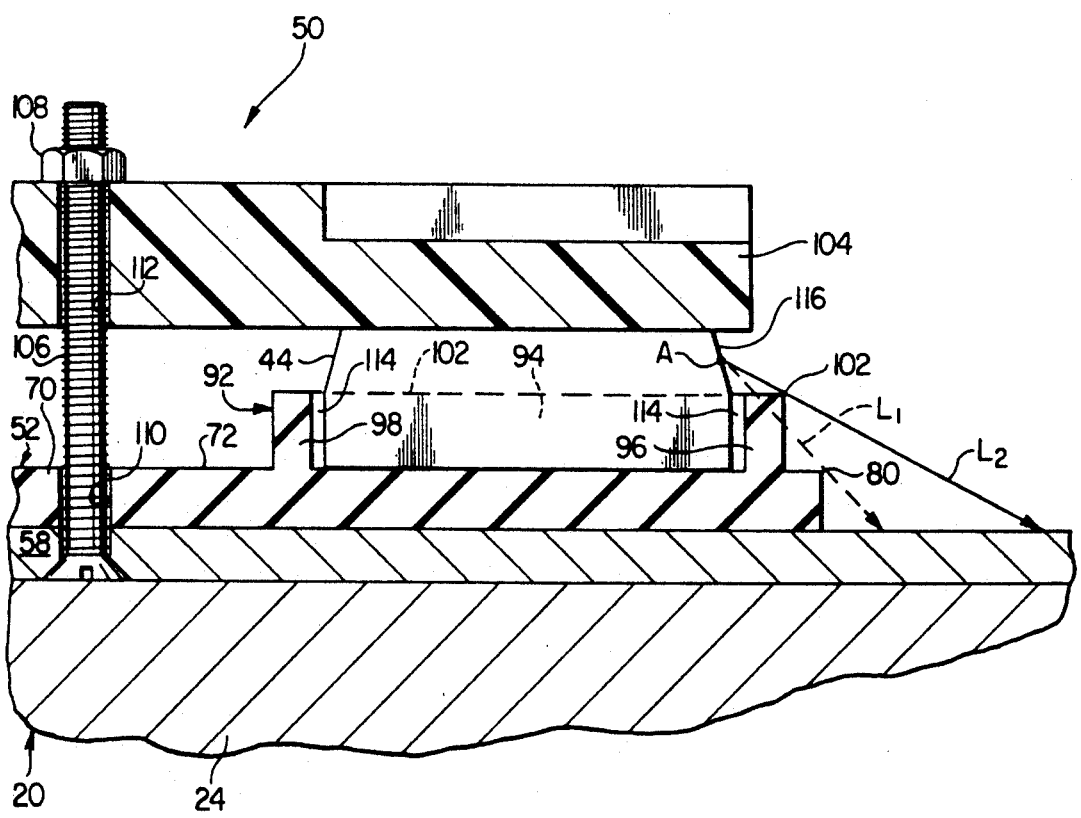
FIG. 3 is an enlarged scale, partially elevational cross-sectional view through a portion of the printed circuit board structure taken along line 3—3 of FIG. 1.

Referring now to FIGS. 1-3, the isolation support structure 50 includes a horizontally elongated rectangular aluminum mounting plate member 58 secured to the front side of the heat sink wall 24 by through-bolts 60 and retaining nuts 62. As best illustrated in FIG. 1, the bottom side edge of the mounting plate 58 is closely adjacent the top side of the circuit board 10. Plate 58 is suitably aligned in a left-to-right direction with the circuit board 10 by means of alignment members 64 secured to the front side of the plate on opposite ends thereof. The alignment members 64 have bottom end pins 66 received in corresponding alignment through-holes 68 formed in the circuit board 10. As can be seen in FIGS. 1 and 3, when the mounting plate 58 is secured to the vertical heat sink wall 24 it forms, in effect, a forward extension of the wall 24 and is in an electrically and thermally conductive relationship therewith.

The support cradle member 52 is formed from a suitable rigid insulating material, preferably an aluminum oxide ceramic material, having a combination of high dielectric strength and high thermal conductivity. As best illustrated in FIGS. 2 and 3, the cradle member 52 has a horizontally elongated rectangular body portion 70 with an outer side surface 72 bounded by top and bottom peripheral side edges 74 and 76, and by left and right end edges 78 and 80. Body portion 70 is secured to the front side of the mounting plate 58 by means of a bolt 82, which extends through the heat sink wall 24 and a circular opening 84 in the cradle body 70, and a retaining nut 86 threaded onto the front end of the bolt. With the support cradle body 70 secured to the mounting plate 58 in this manner, the bottom side edge of the cradle body is closely adjacent the top side of the circuit board 10 as may be best seen in FIG. 1.

Referring now to FIG. 2, the support cradle member 52 is uniquely provided with a horizontally spaced pair of containment rib structures 90 and 92 which are formed integrally with the cradle body 70 and project outwardly from its front side surface 72 at the opposite ends thereof. Each of the rib structures 90, 92 has a generally inverted U-shaped configuration defined by a horizontally extending top wall portion 94 positioned closely adjacent the top side edge 74 of the body side surface 72, and a pair of outer and inner side wall portions 96 and 98 which extend downwardly from the opposite ends of each of the top wall portions 94 and downwardly terminate adjacent the bottom side edge 76 of the front body side surface 72. As illustrated, the outer side wall portions 96 of the rib structures 90, 92 are respectively positioned adjacent the surface end edges 78, 80 of the cradle body 70. Additionally, the forwardly facing surfaces 100 of the rib structures 90, 92 are peripherally bounded by generally inverted U-shaped outer edges 102.

The interiors or "pockets" 101 of the rib structures 90, 92 respectively receive the electrical components 42 and 44 as illustrated in FIGS. 1 and 3. The in-place components 42, 44 and the underlying cradle body 70 are firmly clamped against the mounting plate 58 by a simple holding structure which includes an elongated plastic clamping bar 104 having opposite end portions that overlie and engage the top sides of the electrical components 42,44 respectively disposed within the interiors of the horizontally spaced apart rib structures 90,92. Clamping bar 104 is adjustably forced inwardly against the components 42,44 by the operation of a tightening bolt and nut set 106,108. As viewed in FIG. 3, the bolt 106 extends upwardly through the mounting plate 58, an opening 110 in the cradle body 70, and an opening 112 in the clamp bar 104, and the nut 108 is tightened onto the upper end of the bolt 106.

The side wall portions 96,98 of each of the rib structures 90,92 are spaced apart from one another a distance sufficient to provide small clearance spaces 114 (FIG. 3) on opposite sides of the electrical component which the particular rib structure receives, to allow for thermal expansion of the component. Additionally, as most clearly illustrated in FIG. 3, the projection height of each rib structure is substantially less than the height of the electrical component which it receives and supports.

The unique incorporation of the rib structures 90,92 in the support cradle member 52 provide the overall isolation support structure with several important advantages over conventional isolation structures utilized in this and similar electrical component support applications. First, as illustrated in FIG. 3, the rib structures serve to substantially increase the minimum air clearance space length from all horizontally facing surfaces of the supported electrical components 42,44 to the metal support plate 58 which, as previously mentioned, defines a forward extension of the metal heat sink structure 20 and is in an electrically and thermally conductive relationship therewith.

For example, as to the representative point "A" (positioned on the side surface 116 of component 44 outwardly of the interior of rib structure 92), in the absence of the rib structure 92 the minimum air space clearance length from such point to the electrically conductive mounting plate 58 would be $L_1$-a length measured from point "A" to the plate 58 through a point positioned just outwardly of the edge 80 of wall portion 96 of the rib structure 92.

With the addition of the rib structure 92, however, its side wall portion 96 forms an insulative "barrier" to the minimum air path $L_1$ and effectively increases the minimum air space clearance length, relative to point "A", from $L_1$ to $L_2$-a length now measured from point "A" to the metal mounting plate 58 through a point outwardly adjacent the edge 102 of the rib structure side wall portion 96. A similar increase in the minimum air space clearance length between the component 44 and the adjacent bolt 106 (which, from an electrical conductance standpoint, defines an extension of plate 58) is also achieved.

This substantial increase in the minimum air space clearance length between the supported component 44 and the metal mounting plate 58 and the bolt 106 (and thus the grounded portion of the overall structure) correspondingly diminishes the risk that the component 44 can short to ground. For example, assuming that the component 44 has an input voltage of between 300 and 400 volts, the minimum air space clearance length between the outer surface of the component 44 and the plate 58 would be 8 mm under U.L. and various international electrical safety standards. Thus, if the support cradle 52 was simply an essentially planar ceramic isolation pad, as is conventional practice, the length $L_1$ would have to be a minimum of 8 mm. It can be seen, however, that the unique addition of rib structure 92 automatically builds in a considerable margin of safety by increasing the minimum air space clearance length from $L_1$ to $L_2$.

Alternatively, compared to non-ribbed ceramic isolation pads conventionally utilized in this application, the addition of the rib structure 92 permits the thickness of the cradle body and/or the horizontal distance between the edge 80 and the component 44 to be reduced while still maintaining a minimum 8 mm air space clearance length between the component 44 and the plate 58.

The rib structure 92 also advantageously functions to limit the shifting of the component 44 along the side surface 72 of the support cradle body 70. For example, it can readily be seen in FIG. 3 that a rightward shifting of the component 44 along a non-ribbed isolation pad would progressively decrease the path length $L_1$ as the component rightwardly approached the edge 80. This could easily decrease the length $L_1$ to below the requisite 8 mm length, thereby producing both a code violation and a potential safety hazard.

However, in the support cradle member 52 of the present invention the rib structure side wall 96 acts as a stop to limit such rightward shifting of the component 44. Accordingly, the support cradle member 52 may easily be configured in a manner such that when the component 44 comes into contact with the rib structure side wall 96 the air path length $L_2$ is minimized to an 8 mm or slightly greater length and cannot be further decreased.

While the foregoing discussion has been representatively keyed to shielding and stop functions of the outer sidewall portion 96 of rib structure 92, it will be readily appreciated that these benefits are also provided by all three wall portions of both of the rib structures 90,92 with respect to the supported electrical components 42 and 44. For example, the top wall portions 94 and the inner side wall portions 98 also limit shifting of the components 42 and 44 and substantially increase their minimum air path clearance lengths to adjacent electrically conductive structures such as the metal mounting plate 58 and the tightening bolt 106.

The uniquely configured support cradle member 52 provides yet another advantage over conventional, non-ribbed ceramic isolation pads used to maintain a requisite spacing between high voltage electrical components and electrically conductive heat sink structures and the like upon which they are mounted. The use of these non-ribbed pads typically requires a significant amount of assembly fixturing to be employed to assure proper positioning of the supported electrical components on their associated pads and relative to one another. This necessity, of course, can undesirably add a significant amount of fabrication expense to the completed power supply board 10. In contrast, the use of the rib structures 90,92 permits the components 42 and 44 to be very accurately positioned on the support cradle body 70, and relative to one another, with the use of any such assembly fixturing.

Although the specially designed isolation support structure 50 has been representatively illustrated and described as being incorporated in a printed circuit power supply board, in a computer application, it will be readily appreciated by those skilled in the art that it could readily provide similar advantages in a wide variety of other applications requiring the maintenance of a minimum effective air space separation between electrical components and adjacent grounded, electrically conductive structures such as metal heat sink members.

The foregoing detailed description is to be clearly understood as being given by way of illustration and example only, the spirit and scope of the present invention being limited solely by the appended claims.

What is claimed is:

1. An apparatus mounting an electrical component on a side surface of a thermally and electrically conductive structure in a manner electrically insulating a first portion of the mounted component from said structure, thermally communicating said first portion with said structure, and reliably maintaining at least a predetermined minimum air gap clearance length between the balance of the mounted component and said structure, said apparatus comprising:
   an isolation cradle member comprising an electrically insulative material having a relatively high degree of thermal conductivity, said isolation cradle member including:
      a plate-like body portion having a first side and a second side, said second side being bounded by a peripheral edge, and
      rib means transversely projecting in a first direction outwardly from said second side and positioned adjacent a portion of said peripheral edge, said rib means being operative to:
      (1) define an external pocket on said second side that receives said first portion of said electrical component, with said first portion positioned against said second side of said body within said external pocket and said balance of said electrical component projecting outwardly from said external pocket in said first direction, and
      (2) limit shifting of the received first portion of the electrical component along said second side;
   attachment means securing said body portion to said side surface of said structure with said first side of said body portion facing said side surface of said structure; and
   clamping means engaging said balance of said electrical component and exerting a compressive force on the pocket-supported component and an underlying section of said body portion in a manner increasing both the dielectric strength and the thermal conductivity of said underlying section of said body portion.

2. The apparatus of claim 1 wherein:
said isolation cradle member comprises an aluminum oxide ceramic material.

3. The apparatus of claim 1 wherein:
said peripheral edge of said body portion has generally perpendicular first and second contiguous sections, and
said rib means have generally perpendicular first and second contiguous wall sections respectively positioned parallel with and closely adjacent said first and second contiguous sections of said peripheral edge of said body portion.

4. The apparatus of claim 3 wherein:
said rib means have a generally rectangular U-shaped configuration.

5. The apparatus of claim 1, wherein said clamping means include:
   a clamping bar member overlying and engaging said balance of the mounted component, and
   screw means extending through said clamping bar member and said body portion, said screw means clamping the mounted component between said body portion and said clamping member.

6. An isolation cradle structure mounting first and second electrical components in a spaced apart relationship on a side surface of an electrically conductive structure, said isolation cradle structure being interposed between said components and said electrically conductive structure, said isolation cradle structure being of an electrically insulative, thermally conductive material and comprising:
   a plate-like body portion having an inner side positioned against said electrically conductive structure, and an outer side bounded by a peripheral edge;
   spaced apart first and second rib means formed on and projecting outwardly from said outer side of said body portion and in close adjacency with portions of said peripheral edge, said in close adjacency with portions of said peripheral edge, said first and second rib means, respectively,
      (1) defining first and second external pockets on said outer side of said body portion that respectively receive first portions of said first and second components in a manner such that the received first portions are in contact with sections of said outer side within said pockets, with the balance of each component projecting outwardly beyond its associated rib means in direction transverse to said outer side of said body portion, '(2) reducing the effective air gap clearance distances between the received first and second electrical components and said electrically conductive structure, and
      (3) limiting shifting of said first and second electrical components relative to said body portion parallel to said outer side thereof; and means holding said electrical components against said plate-like body portion.

7. The isolation cradle structure of claim 6 wherein:

said isolation cradle structure comprises an aluminum oxide ceramic insulating material.

8. The isolation cradle structure of claim 6 wherein:
each of said first and second rib means has a generally rectangular U-shaped configuration.

9. An isolation cradle structure mounting an electrical component on a side surface of an electrically conductive structure, said isolation cradle structure being interposed between the mounted component and said electrically conductive structure, said isolation cradle structure being of an electrically insulative, thermally conductive material and comprising:
a-plate like body portion having an inner side positioned against said electrically conductive structure, and an outer side bounded by a peripheral edge;
rib means on and projecting outwardly from said outer side of said body portion and in close adjacency with a portion of said peripheral edge, said rib means to;
(1) defining an external pocket on said outer side of said body portion that receives a first portion of said electrical component in a manner such that the received first portion is in contact with said outer side within said pocket, with the balance of asid electrical component projecting outwardly beyond said rib means in a direction transverse to said outer side of said body portion,
(2) reducing the effective air gap clearance distance between said electrical component and said electrically conductive structure, and
(3) limiting shifting of said electrical component relative to said portion parallel to said outer side thereof; and means holding said electrical component against said plate-like body portion.

10. The isolation cradle structure of claim 9 wherein:
said isolation cradle structure comprises an aluminum oxide ceramic insulating material.

11. The isolation cradle of claim 9 wherein:
said peripheral edge has two contiguous, generally perpendicular first and second portions, and
said rib means have first and second contiguous, generally perpendicular wall portions respectively positioned inwardly adjacent and generally parallel to said first and second portions of said peripheral edge.

12. The isolation cradle structure of claim 11 wherein:
said rib means have a generally rectangular U-shaped configuration.

13. Printed circuit board apparatus comprising:

a circuit board having printed circuitry operatively associated therewith, and a side edge portion;
a heat sink structure supported on said side edge portion of said circuit board and having a side surface;
a relatively high voltage electrical component electrically connected to said printed circuitry; and
mounting means mounting said electrical component on said side surface of said heat sink structure, said mounting means being operative to thermally communicate said electrical component with said heat sink structure and electrically isolate said electrical component from said heat sink structure, said mounting means including:
an isolation cradle member comprising an electrically insulative material having a relatively high degree of thermal conductivity, said isolation cradle member including a plate-like body portion having a first side, and a second side bounded by a peripheral edge and rib means extending transversely outwardly from said second side and positioned adjacent a portion of said peripheral edge, said rib means defining an external pocket on said second side which receives a first portion of said electrical component, with the balance of said electrical component projecting outwardly of said rib means in a direction transverse to said second side of said body portion, said rib means functioning to limiting shifting of the received first portion of said electrical component relative to said body portion in a direction parallel to said second side thereof,
attachment means securing said body portion on said side surface of said heat sink structure with said first side of said body portion facing said side surface of said heat sink structure, and
clamping means engaging said balance of said electrical component and exerting a compressive force on the pocket-supported component and an underlying section of said body portion in a manner increasing both the dielectric strength and the thermal conductivity of said underlying section of said body portion.

14. The printed circuit board apparatus of claim 13 wherein said printed circuit board apparatus is a printed circuit power supply board.

15. The printed circuit board apparatus of claim 13 wherein:
said side surface of said heat sink structure is generally perpendicular to said circuit board.

16. The printed circuit board apparatus of claim 13 wherein:
said isolation cradle member comprises an aluminum oxide ceramic insulation material.

* * * * *

UNITED STATES PATENT AND TRADEMARK OFFICE
CERTIFICATE OF CORRECTION

PATENT NO. : 5,134,545
DATED : July 28, 1992
INVENTOR(S) : Darryl K. Smith

It is certified that error appears in the above-identified patent and that said Letters Patent is hereby corrected as shown below:

Col. 8, lines 47-48, "in close adjacency with portions of said peripheral edge, said" should be deleted due to repetition.

Column 8, line 56, "in direction" should be --in a direction--.

Column 8, line 58, "portion,'(2)" should be --portion,-- and (2) should have been new paragraph.

Column 9, line 20, "means to;" should be --means:--.

Column 9, line 26, "asid" should be --said--.

Signed and Sealed this

Twenty-fourth Day of August, 1993

Attest:

BRUCE LEHMAN

Attesting Officer

Commissioner of Patents and Trademarks